(12) United States Patent  
Hernandez et al.

(10) Patent No.: US 7,475,506 B2  
(45) Date of Patent: Jan. 13, 2009

(54) INFORMATION HANDLING SYSTEM PRODUCT BADGE ORIENTATION SYSTEM AND METHOD

(75) Inventors: David J. Hernandez, Round Rock, TX (US); Pedro M. Alfonso, Austin, TX (US); Bradley Jackson, Austin, TX (US); Kenneth Musgrave, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 856 days.

(21) Appl. No.: 10/760,818

(22) Filed: Jan. 20, 2004

(65) Prior Publication Data

US 2005/0157455 A1 Jul. 21, 2005

(51) Int. Cl.  
*G09F 3/18* (2006.01)

(52) U.S. Cl. ...................... 40/661.11; 40/668
(58) Field of Classification Search ............. None
See application file for complete search history.

(56) References Cited

U.S. PATENT DOCUMENTS 2,085,813 A * 7/1937 Martin ................... 40/207
3,269,212 A * 8/1966 Voland ................... 74/504
4,300,525 A * 11/1981 Delgado et al. .......... 126/42
6,477,799 B1   11/2002 Erickson et al. .......... 40/406

* cited by examiner

*Primary Examiner*—Joanne Silbermann  
(74) *Attorney, Agent, or Firm*—Hamilton & Terrile, LLP; Robert W. Holland

(57) ABSTRACT

A product badge coupled to a product, such as an information handling system, has a manually-selectable orientation to allow the orientation of the product badge to change for adapting to changes in the orientation of the product. A product badge support rotationally couples the product badge to the product for user selection of a desired orientation of product information, such as a manufacturer logo or a product identification number. Manual activation to change product badge orientation includes pushing the product badge into the product badge support to engage opposing cams, pushing the product badge edge to rotate the product badge to an opposing side having product information of another orientation, and pushing the product badge to activate a retention mechanism for release and retention of a selected of plural clips.

4 Claims, 6 Drawing Sheets

INFORMATION HANDLING SYSTEM PRODUCT BADGE ORIENTATION SYSTEM AND METHOD

BACKGROUND OF THE INVENTION

1. Field of the Invention

The present invention relates in general to the field of information handling system product badges, and more particularly to a system and method for adjusting product badge orientation to match information handling system orientation.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems have become fixtures in many homes and businesses, fitting into a variety of physical locations having various space constraints. Desktop, tower and server information handling systems are often placed in a variety of orientations depending upon the space available in a given area of use and other factors, such as the proximity of power and network connections. As a result, information handling system manufacturers have designed information handling systems to reliably operate regardless of orientation, such as horizontal or vertical orientations. Indeed, information handling system manufacturers often include stands that support a given information handling system in different orientations so that a user may securely place the information handling system in a desired orientation with reduced risk of damage from falling over. Thus, for instance, desktop information handling systems that are generally designed to rest horizontally on a desk are often instead placed in a vertical orientation under a desk.

One difficulty with the different orientations used with information handling systems is that product badges that identify the manufacturer brand, model or other information are typically affixed to the outer surface of the information handling system in a single orientation. If a product badge is affixed to appear upright with a horizontal orientation, then the badge will appear sideways when the information handling system rests in a vertical orientation. In some instances, information handling systems are even designed and shipped to rest in orientations that result in the badge appearing upside down. Product badges typically carry brand logos that identify the manufacturer of the information handling system. Brand logos are typically used to build an identity for the user of the information handling system with the manufacturer on the brand, such as by associating a positive user experience with the manufacturer. The appearance of the logo in different orientations interferes with the building of brand identity. In addition, product badges sometimes carry product information for the user to read and apply, such as unique product identification numbers. The product information is often difficult to read when the information appears in an upside down or sideways orientation relative to a user who is trying to read the information. In either case, the product badges generally are affixed to prevent inadvertent loss of the associated information and are thus not removable for the user to detach and read.

SUMMARY OF THE INVENTION

Therefore a need has arisen for a system and method which selectively alters the orientation of an information handling system product badge.

In accordance with the present invention, a system and method are provided which substantially reduce the disadvantages and problems associated with previous methods and systems for coupling a product badge to an information handling system. A product badge manually activates to selected orientations for presenting product information of the product badge in an orientation desired by a user with the selected orientation associated with the product's orientation.

More specifically, a product badge support fixedly couples to a product surface, such as at the outer surface of an information handling system housing, to rotationally couple a product badge for display of product information at selectable orientations, such as a manufacturer logo or identification number. In one embodiment, product information is displayed on opposing sides of the product badge at different orientations so that a user selects product information by flipping between sides of the product badge. In other embodiments, pressing on the product badge allows rotation of product information displayed on the product badge to selected orientations. For instance, a retention mechanism engages a clip of the product badge with plural clips disposed at plural orientations. Alternatively, opposing cams of the product badge and product badge support engage to introduce rotational motion of the product badge to selected orientation. Thus, users of an information handling system are able to select product badge orientation to align with information handling system orientation for improved appearance, such as by placing a logo in an upright orientation, or improved usability, such as by placing a product identification number in a readable position for a user looking at the information handling system.

The present invention provides a number of important technical advantages. One example of an important technical advantage is that product badge orientation is selectable to adjust to various orientations of the product. Information handling system product brand logo orientation is user selectable to match information handling system orientation to improve appearance and build user identity with a manufacturer brand. Difficult-to-read product information is more easily read by a user through adjustment of a product badge so that the information appears properly oriented to the user. For instance, a user sees identification numbers upside down when the user bends over the top of an information handling system to read the product identification number from a product badge at the back of the system. The user is able to adjust the product badge to an inverted position so that the identification number appears normal to the user and is thus easier to read.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Selective orientation of an information handling system product tag allows a user to align the product tag for a desired appearance with a variety of information handling system orientations. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 2:
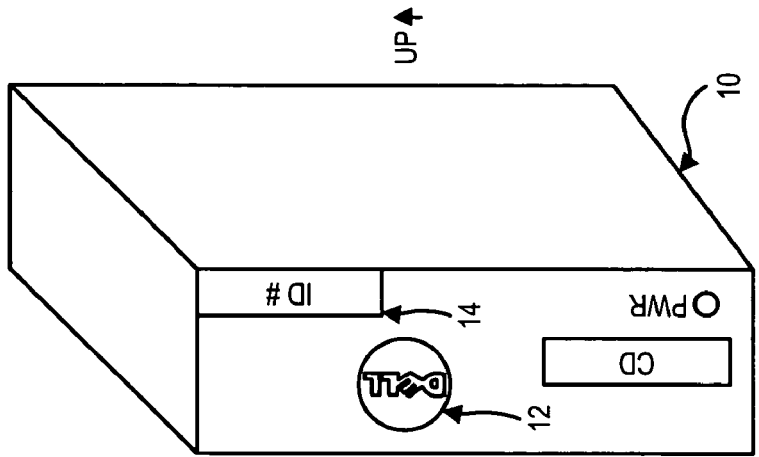
FIG. 2 depicts an information handling system in a vertical orientation.
Figure 1:
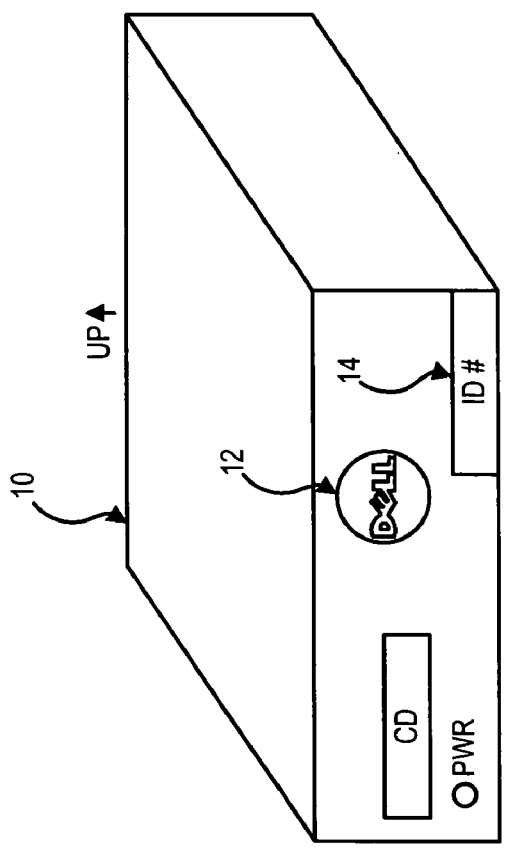
FIG. 1 depicts an information handling system in a horizontal orientation.

Referring now to FIG. 1, a top perspective view of an information handling system 10 is depicted in a horizontal configuration. For instance, information handling system 10 is a desktop system adapted to rest on a user's desktop underneath a monitor with the outer housing protecting processing components, such as processors and memory, that process information for display. However, as is depicted by FIG. 2, information handling system 10 is also adapted to rest in a vertical configuration. In the horizontal configuration, a product badge 12 having the "DELL" logo is displayed to align in a horizontal appearance. However, if information handling system 10 is rotated to a vertical configuration as depicted by FIG. 2, the logo of product badge 12 also rotates to a vertical appearance that disrupts the intended appearance of the logo. Similarly, a product badge 14, depicted in FIGS. 1 and 2 at the front of information handling system 10 but usually located at the rear, rotates from horizontal to vertical appearances to make the identification number or other product information on product badge 14 more difficult to read. Rotational coupling of product badges 12 and 14 allow a user to select a product badge orientation that adapts to an information handling system orientation.

Figure 4:
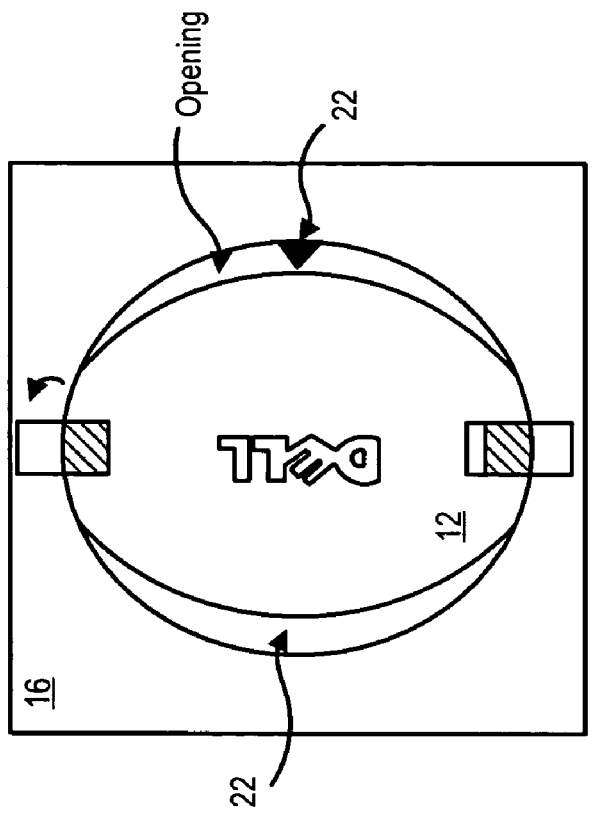
FIG. 4 depicts the rotationally coupled product badge of FIG. 3 partially rotated to expose an opposing side having a product label with a vertical orientation.
Figure 3:
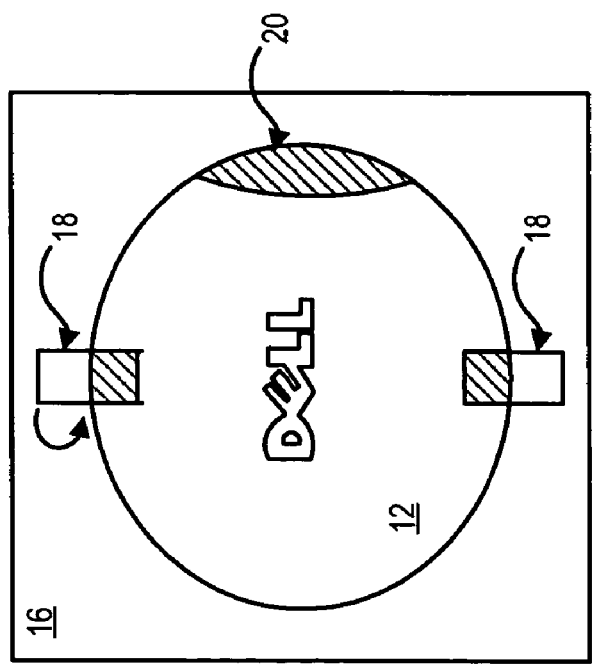
FIG. 3 depicts a rotationally coupled product badge having a product label with a horizontal orientation.

Referring now to FIGS. 3 and 4, one embodiment for rotational coupling of a product badge 12 is depicted. A product badge support 16 fixedly couples with the outer surface of information handling system 10 and rotationally couples with product badge 12 to display the "DELL" logo in one of two selected orientations. As depicted by FIG. 3, the logo is displayed with an orientation substantially perpendicular to a rotational axis 18 on one side of product badge 12. By pressing on a selection tab 20 at one edge of product badge 12, a user generates a rotational force about axis 18 to cause product badge 12 to rotate and display its opposing side. As depicted by FIG. 4, the logo on the opposing side of product badge 12 is displayed with an orientation substantially parallel to rotational axis 18. Friction tabs 22 provide resistance to initial rotational movement of product badge 12 to reduce inadvertent activation of a logo orientation change. The embodiment of FIGS. 2 and 3 provides users with an intuitive way of selecting between two orientations for display of product information, such as orientations that correspond to vertical and horizontal resting orientations of an information handling system.

Figure 5:
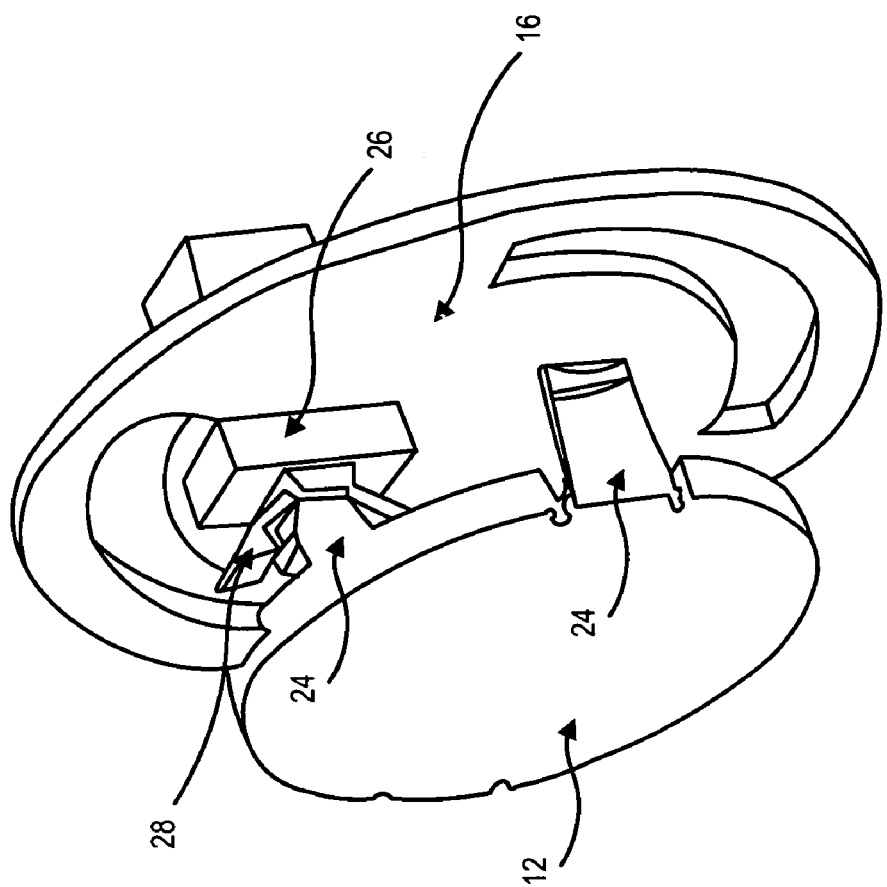
FIG. 5 depicts a rotationally coupled product badge having plural clips and a product badge support having retention mechanism.

Referring now to FIG. 5, another embodiment for rotational coupling of a product badge 12 is depicted. Plural clips 24 extend from product badge 12 with each clip associated with an orientation of product badge 12 relative to a retention mechanism 26 that is fixedly coupled to product badge support 16. Retention mechanism 26 retains an aligned clip 24 with opposing movable clip arms 28. Clip arms 28 are activated to separate from each other and release clip 24 when product badge 12 is pressed into retention mechanism 26. Near the bottom of a plunger movement by retention mechanism 26, a catch engages to hold clip arms 28 apart for removal of clip 24. Product badge 12 is then manually rotated to a desired orientation that is associated with an alignment of a clip 24 and retention mechanism 26. Once a desired clip 24 associated with a desired orientation of product badge 12 is found, product badge 12 is pressed into retention mechanism 26 to disengage the catch holding apart clip arms 28 and re-engage clip arms 28 onto clip 24. In one embodiment, a flexible material, such as a spring, holds product badge 12 to product badge support 16 to ensure that product badge 12 is not separated from information handling system 10 and lost.

Figure 6:
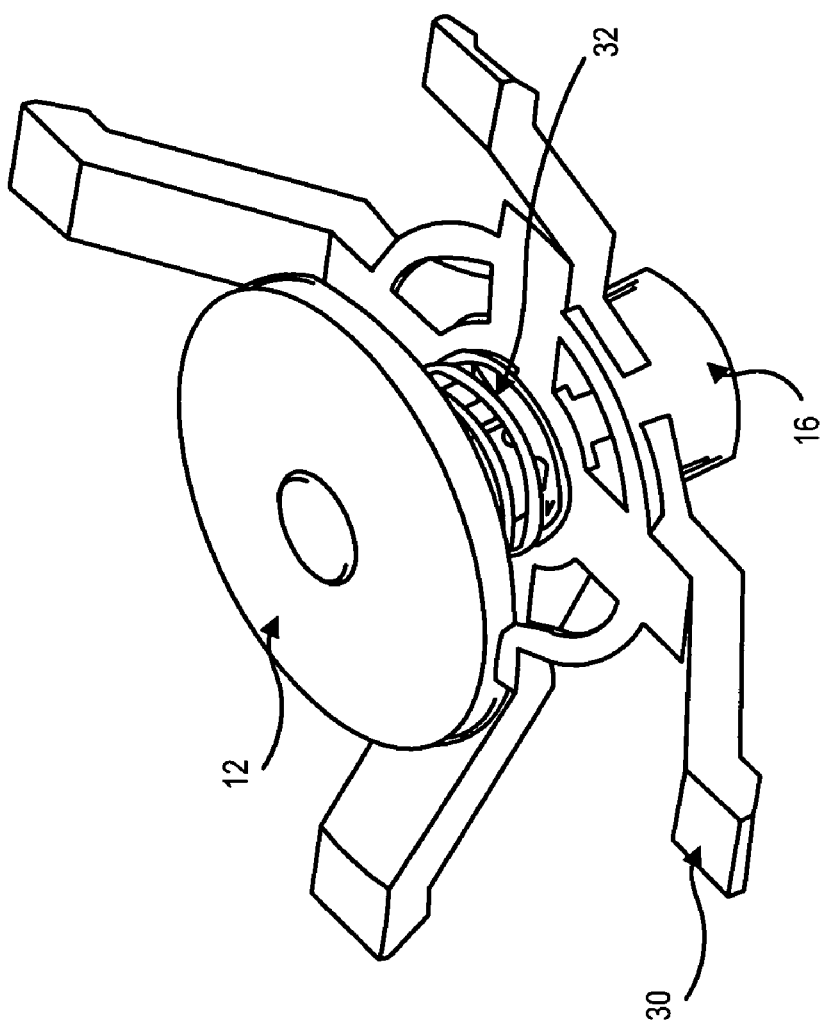
FIG. 6 depicts an assembled product badge and support rotationally coupled with a pushrod and opposing cams.
Figure 7:
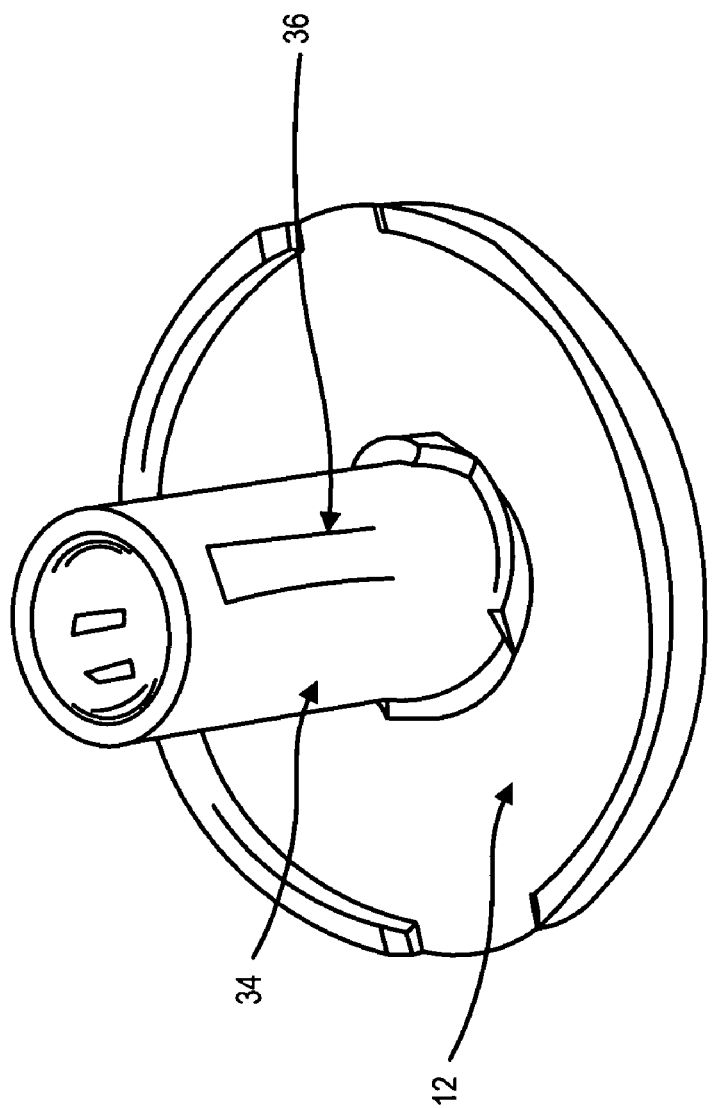
FIG. 7 depicts a pushrod and cam extending from the rear surface of a product badge.
Figure 8:
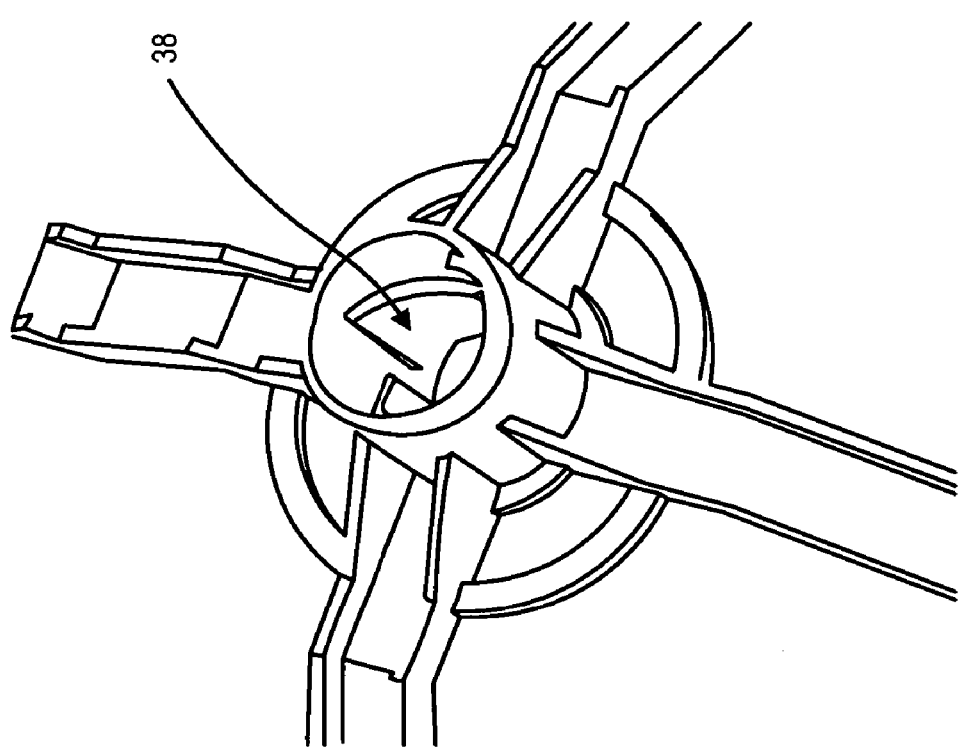
FIG. 8 depicts a product badge support having cams aligned to rotationally engage the pushrod cams.

Referring now to FIGS. 6, 7 and 8, another embodiment for rotational coupling of a product badge 12 is depicted. Product badge support 16 couples to information handling system 10 with arms 30. Rotation of product badge 12 is activated by pressing on product badge 12 to overcome an outward bias provided by spring 32 inserted between product badge 12 and product badge support 16. A pushrod 34 attached to the rear side of product badge 12 engages cams 36 extending from the outer circumference of pushrod 34 into cams 38 extending from the inner circumference of the opening of product badge support 16. The cams 38 of product badge support 16 introduce a rotational movement to product badge 12 as pushrod 34 passes through product badge support 16 and spring 32 compresses. Once cams 38 introduce the desired amount of rotation, the engagement is completed and pushrod 34 returns to its extended position along a straight edge of cams 38 by the biasing force of spring 32 to attain a desired amount of rotation of product badge 12, such as ninety or one hundred and eighty degrees.

Although the present invention has been described in detail, it should be understood that various changes, substitutions and alterations can be made hereto without departing from the spirit and scope of the invention as defined by the appended claims.

What is claimed is:

1. An information handling system comprising:
    a housing having an outer surface;
    processing components disposed within the housing and operable to process information;
    a product badge having product information; and
    a product badge support coupled to the housing and supporting the product badge for display at the outer surface of the housing at plural user-selectable orientations;
    wherein the product badge support comprises:
        a pushrod having a first end that supports the product badge and a second end forming a cam;
        a product badge support housing having an opening disposed to accept the pushrod, the opening having an opposing cam aligned to engage the pushrod cam; and
        a spring disposed between the product badge and the product badge support housing, the spring aligned to bias the push rod out of the product badge support housing;
    wherein pressing the product badge engages the pushrod and product badge support housing cams to turn the product badge.

2. The information handing system of claim 1 wherein each press of the product badge turns the product badge information orientation by approximately ninety degrees.

3. The information handling system of claim 1 wherein the product information comprises a brand logo.

4. The information handling system of claim 1 wherein the product information comprises an identification number.

* * * * *